United States Patent
Masuyama et al.

(10) Patent No.: US 9,913,399 B2
(45) Date of Patent: Mar. 6, 2018

(54) SYSTEM AND METHOD FOR WIRELESS RACK MANAGEMENT CONTROLLER COMMUNICATION

(71) Applicant: Dell Products, LP, Round Rock, TX (US)

(72) Inventors: Jinsaku Masuyama, Cedar Park, TX (US); Sajjad S. Ahmed, Round Rock, TX (US); John R. Palmer, Georgetown, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 34 days.

(21) Appl. No.: 14/617,548

(22) Filed: Feb. 9, 2015

(65) Prior Publication Data
US 2016/0234960 A1    Aug. 11, 2016

(51) Int. Cl.
*H05K 7/14* (2006.01)

(52) U.S. Cl.
CPC .................................. *H05K 7/1498* (2013.01)

(58) Field of Classification Search
None
See application file for complete search history.

(56) References Cited

U.S. PATENT DOCUMENTS

| | | | |
|---|---|---|---|
| 5,335,985 A | 8/1994 | Baur | |
| 5,434,775 A | 7/1995 | Sims et al. | |
| 5,505,533 A | 4/1996 | Kammersqard et al. | |
| 5,774,668 A | 6/1998 | Choquier et al. | |
| 5,805,442 A | 9/1998 | Crater et al. | |
| 5,869,820 A | 2/1999 | Chen et al. | |
| 5,910,776 A | 6/1999 | Black | |
| 5,913,034 A | 6/1999 | Malcolm | |
| 5,926,463 A | 7/1999 | Ahearn et al. | |
| 5,956,665 A | 9/1999 | Martinez et al. | |
| 5,956,723 A | 9/1999 | Zhu | |
| 5,959,012 A | 9/1999 | Simonian et al. | |
| 6,057,981 A | 5/2000 | Fish et al. | |
| 6,112,246 A | 8/2000 | Horbal et al. | |
| 6,131,119 A | 10/2000 | Fukui | |
| 6,167,448 A | 12/2000 | Hemphill et al. | |
| 6,282,175 B1 | 8/2001 | Steele et al. | |
| 6,601,084 B1 | 7/2003 | Bhaskaran et al. | |
| 6,611,755 B1 | 8/2003 | Coffee et al. | |
| 6,654,347 B1 | 11/2003 | Wiedeman et al. | |
| 6,714,977 B1 | 3/2004 | Fowler et al. | |
| 6,826,714 B2 | 11/2004 | Coffey et al. | |
| 6,853,551 B2 * | 2/2005 | Baar | H05K 7/1424 345/519 |
| 7,209,358 B2 * | 4/2007 | Garnett | G11B 33/126 361/735 |
| 7,298,626 B1 | 11/2007 | Senogles et al. | |

(Continued)

*Primary Examiner* — Courtney Smith
*Assistant Examiner* — Rashen E Morrison
(74) *Attorney, Agent, or Firm* — Larson Newman, LLP

(57) ABSTRACT

An information handling system, includes a server rack including a first communication device. The server rack has a mounting flange with a plurality of mounting holes. The information handling system also includes a server installed in the server rack and secured to the mounting flange via a first mounting hole of the plurality of mounting holes. The server includes a second communication device, that is coupled to the first communication device via a second mounting hole of the plurality of mounting holes.

14 Claims, 4 Drawing Sheets

(56) References Cited

U.S. PATENT DOCUMENTS

| | | | |
|---|---|---|---|
| 7,696,506 B2 | 4/2010 | Lung | |
| 7,720,987 B2 | 5/2010 | Penk et al. | |
| 7,920,527 B2 * | 4/2011 | Rakshani | H04W 4/18 370/203 |
| 8,037,330 B2 | 10/2011 | Livescu et al. | |
| 8,369,092 B2 * | 2/2013 | Atkins | G06F 1/187 361/727 |
| 8,732,508 B2 | 5/2014 | Cochran et al. | |
| 9,014,911 B2 | 4/2015 | Ricci | |
| 2002/0095487 A1 | 7/2002 | Day et al. | |
| 2002/0141210 A1 | 10/2002 | Glannopoulos et al. | |
| 2002/0153411 A1 | 10/2002 | Wan et al. | |
| 2002/0194412 A1 * | 12/2002 | Bottom | G06F 13/4068 710/301 |
| 2003/0046339 A1 | 3/2003 | Ip | |
| 2003/0168259 A1 | 9/2003 | Miller et al. | |
| 2004/0010649 A1 | 1/2004 | Weaver et al. | |
| 2005/0099766 A1 * | 5/2005 | Fraley | G11B 27/36 361/679.33 |
| 2006/0103504 A1 | 5/2006 | Vasallo | |
| 2006/0190634 A1 * | 8/2006 | Bennett | H04M 1/7253 710/15 |
| 2007/0094426 A1 | 4/2007 | Chiang et al. | |
| 2007/0140787 A1 * | 6/2007 | Champion | G06F 1/183 403/321 |
| 2008/0165507 A1 | 7/2008 | Belady et al. | |
| 2008/0317021 A1 | 12/2008 | Ives et al. | |
| 2009/0070697 A1 | 3/2009 | LaForest | |
| 2009/0097200 A1 * | 4/2009 | Sharma | G06F 1/18 361/688 |
| 2009/0189774 A1 | 7/2009 | Brundridge et al. | |
| 2009/0217073 A1 | 8/2009 | Brech et al. | |
| 2009/0244830 A1 * | 10/2009 | Wyatt | H05K 7/20809 361/679.47 |
| 2009/0307515 A1 | 12/2009 | Bandholz et al. | |
| 2009/0322492 A1 | 12/2009 | Hannah et al. | |
| 2010/0027687 A1 | 2/2010 | De Natale et al. | |
| 2010/0106154 A1 | 4/2010 | Harlev et al. | |
| 2011/0022245 A1 | 7/2011 | Goodrum et al. | |
| 2011/0179301 A1 | 7/2011 | Liu et al. | |
| 2011/0215946 A1 | 9/2011 | Aguren | |
| 2011/0289327 A1 | 11/2011 | Nolterieke et al. | |
| 2011/0298607 A1 * | 12/2011 | Priyantha | G06Q 10/087 340/505 |
| 2012/0031964 A1 | 2/2012 | Thielmann et al. | |
| 2012/0066519 A1 | 3/2012 | El-Essawy et al. | |
| 2012/0166693 A1 | 6/2012 | Weinstock et al. | |
| 2012/0170191 A1 | 7/2012 | Jensen et al. | |
| 2012/0182151 A1 | 7/2012 | Tong et al. | |
| 2012/0220216 A1 | 8/2012 | Carbonell Duque et al. | |
| 2012/0262956 A1 | 10/2012 | DeHaven | |
| 2012/0303767 A1 | 11/2012 | Renzin | |
| 2013/0007249 A1 | 1/2013 | Wang et al. | |
| 2013/0227291 A1 | 8/2013 | Ahmed et al. | |
| 2014/0002055 A1 | 1/2014 | Costa | |
| 2014/0240914 A1 * | 8/2014 | Meert | H04Q 1/06 361/679.31 |
| 2014/0244881 A1 * | 8/2014 | Stewart | G06F 13/4081 710/302 |
| 2014/0244886 A1 * | 8/2014 | Meert | G06F 13/409 710/306 |

* cited by examiner

SYSTEM AND METHOD FOR WIRELESS RACK MANAGEMENT CONTROLLER COMMUNICATION

FIELD OF THE DISCLOSURE

This disclosure relates generally to information handling systems, and more particularly relates to a system and method for providing wireless rack management controller communication in a server rack.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

A data center is a facility to house a group of networked information handling systems typically used by organizations for the remote storage, processing, or distribution of large amounts of data. The data center may include associated components such as telecommunication systems, storage systems, power supplies, environmental controls, and security infrastructure. The data center also normally includes a group of server racks that house the information handling systems, and that are located on floor tiles of a raised floor. A space below the raised floor can be utilized to provide an air flow from an air conditioning system to the server racks.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display.

Figure 1:
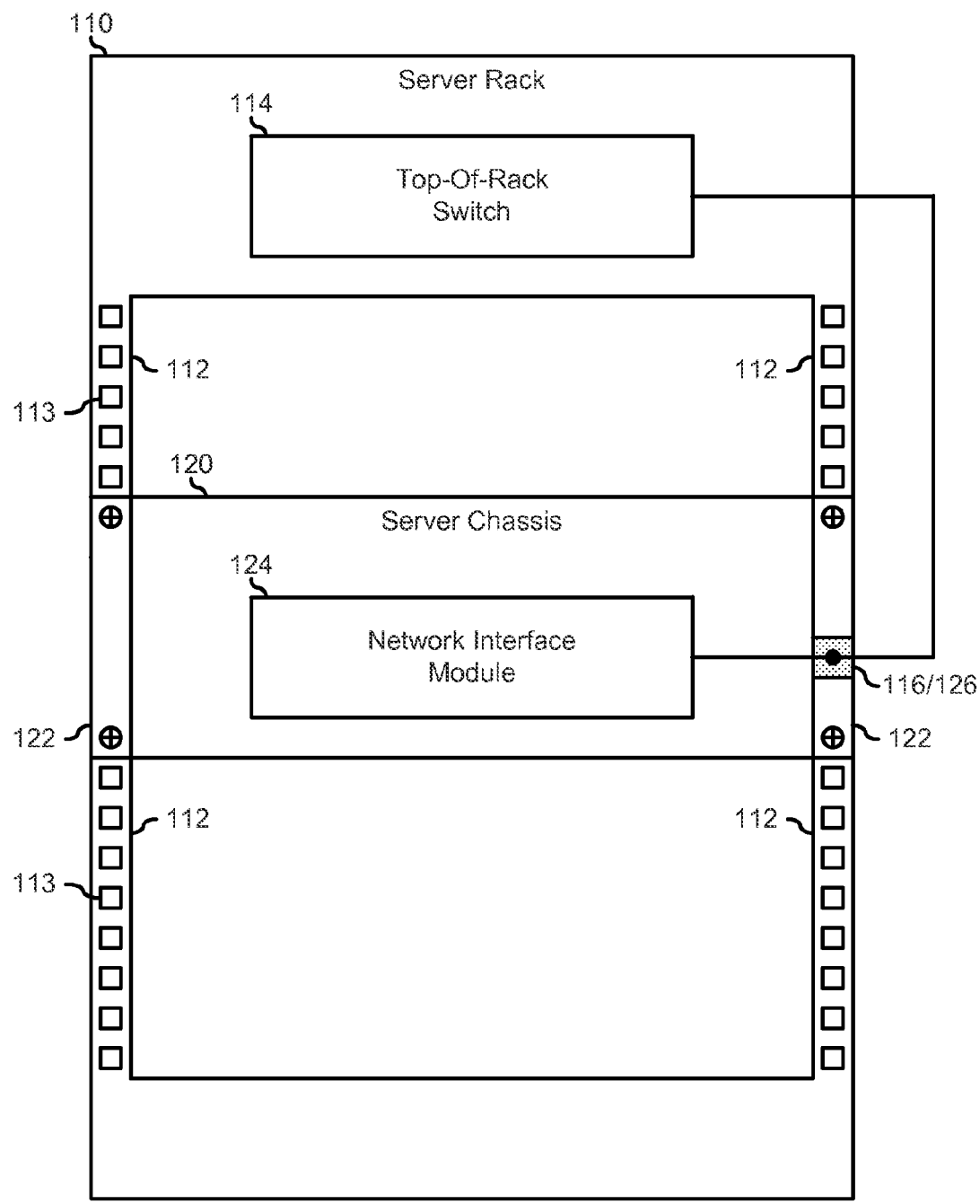
FIG. 1 is a front view of a rack system according to an embodiment of the present disclosure.

FIG. 1 illustrates a front view of an embodiment of a rack system 100 including a server rack 110 and a server chassis 120. Server rack 110 provides for the installation of equipment within the server rack. In particular, the equipment inserted into server rack 110 and is secured to flanges 112 of the server rack that include pre-positioned mounting holes 113, through which fasteners are attached to rigidly secure the equipment to the server rack. As such, server chassis 120 includes mounting ears 122 attached to the side of the server chassis that provide mounting surfaces that engage with flanges 112. Mounting ears 122 include pre-positioned mounting holes that align with mounting holes 113, through which the fasteners are attached. An example of rack system 100 includes a server rack and installed equipment that are in conformance with an Electronics Industries Alliance (EIA) Standard EIA-310-E for Cabinets, Racks, Panels, and Associated Equipment (1996), with a Consumer Electronics Association (CEA) Standard CEA-310-E Design Requirements for Cabinets, Panels, Racks, and Subracks (2005), or the like.

Server rack 110 includes a top-of-rack (ToR) switch 114 that operates to provide switching and routing of the network traffic between the equipment installed in the server rack, to other rack systems similar to rack system 100, and to other external networks, as needed or desired. Server chassis 120 includes a network interface module 124 that operates to provide switching and routing of the network traffic within the server chassis and to ToR switch 114, as needed or desired. ToR switch 114 is connected to a communication module 116 that is affixed to the back of mounting flange 112, and that is collocated with one of mounting holes 113. Network interface module 124 is connected to a communication module 126 that is affixed to the front of mounting ear 122, and is adjacent to communication module 116.

Communication modules 116 and 126 operate to communicate with each other wirelessly. In particular, communication modules 116 and 126 advantageously utilized a mounting hole 113 to permit the uninterrupted wireless communication of the network traffic between the communication modules. An example of a wireless communication link includes a Wireless Universal Serial Bus (USB) communication link, a Bluetooth communication link, a Bluetooth with Enhanced Data Rate (EDR) communication link, a WiFi (IEEE 802.11ac) communication link, a ZigBee communication link, a short-range optical wireless communication link such as an IEEE 802.15.7 link, or another wireless communication link, as needed or desired. In a particular embodiment, communication modules 116 and 126 operate to connect to respective ToR switch 114 and network interface module 124 via a network fabric, such as an Ethernet fabric, a FiberChannel fabric, or another network fabric, as needed or desired. As such, communication modules 116 and 126 will include an interface between the network fabric interface and respective wireless communication modules 210 and 220, and thus the communication modules represent additional hardware or software features as needed to translate communication signals from one standard to the other, as needed or desired.

Routing network communication between ToR switch 114 and network interface module 124 via communication modules 116 and 126 permits reduced cabling at the back of rack system 100, which is typically already very cluttered with power cords, network communication cables, and the like. Instead, the network communication cables can be routed on the side of rack system 100, behind mounting flanges 112, which is typically unused space in a rack system. In a particular embodiment, the network communication embodied in rack system 100 represents primary data processing traffic, such as traffic between the equipment in server rack 110, that is, between server chassis 120 and one or more additional pieces of equipment in the server rack, traffic between the server chassis and one or more additional server racks, or between the server chassis and an external network, such as the Internet. In another embodiment, the network communication embodied in rack system 100 represents management traffic, such as traffic between a management controller of server chassis 120 and a management controller of server rack 120, or other management controllers and systems of the data center. For example, ToR switch 114 can be connected to a rack management controller, and network interface module 124 can be connected to a baseboard management controller, a chassis management controller, or the like. An example of a management controller includes an Integrated Dell Remote Access Controller (iDRAC).

Figure 2:
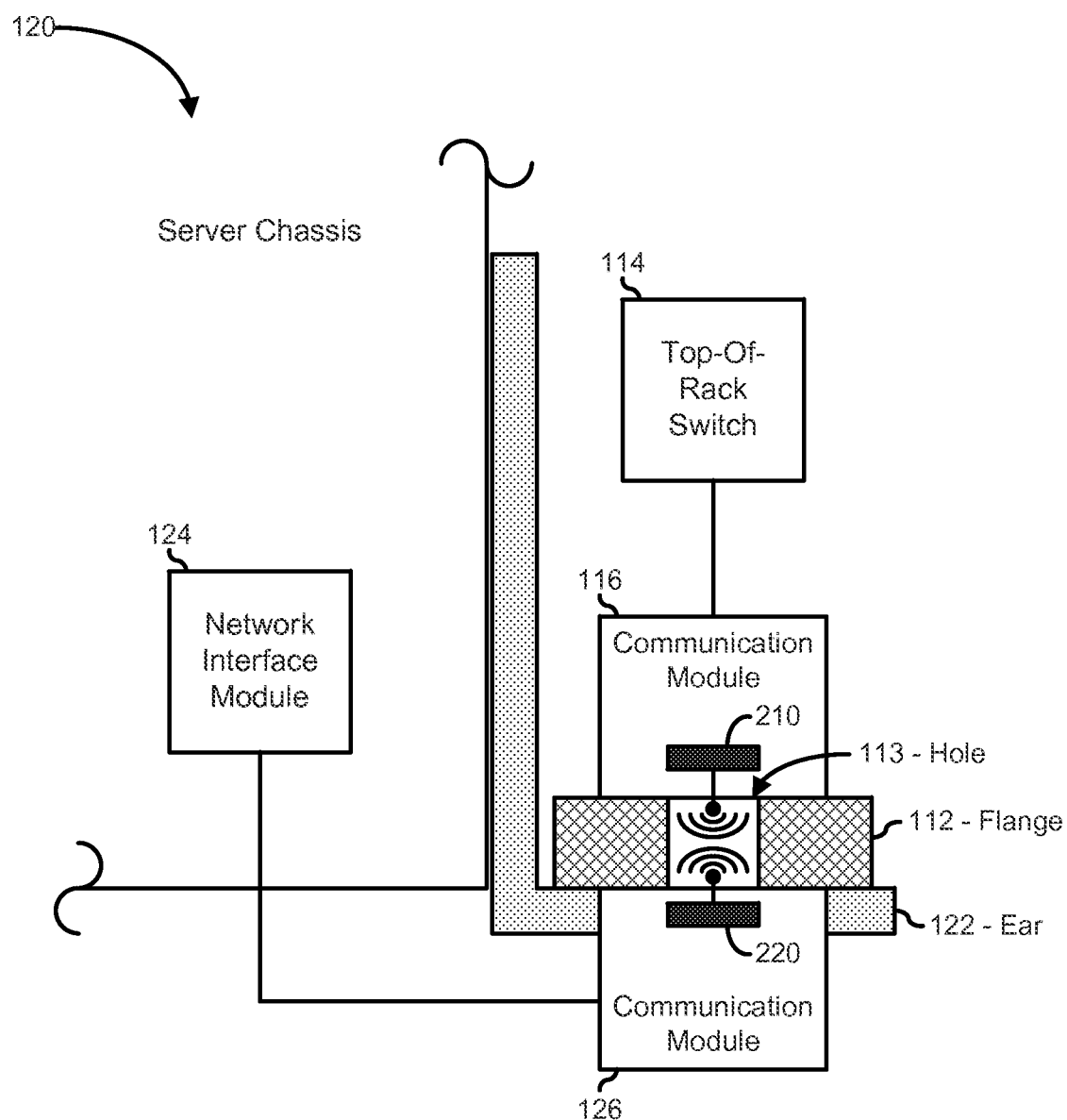
FIG. 2 is a top view of the rack system of FIG. 1.

FIG. 2 illustrates a top view of a portion of rack system 100. Here server chassis 120 is attached to right side mounting ear 122 that is engaged with mounting flange 112 of server rack 110. The fasteners are not illustrated herein, and would be understood to be above and below the level of the present illustration. Mounting flange 112 is shown with communication module 116 attached, and mounting ear 122 is shown with communication module 126 attached. Communication module 116 includes a wireless communication module 210 and communication module 126 includes a wireless communication module 220. Wireless communication modules 210 and 220 are illustrated as being in communication with each other through mounting hole 113.

In a particular embodiment, communication modules 116 and 126 represent add-on modules that are affixed to mounting flange 112 and to mounting ear 122 at the time that server chassis 120 is installed into server rack 110. Here, server chassis 120 can be secured to server rack 110 and then communication modules 116 and 126 can be collocated with any available mounting hole 113. In another embodiment, communication module 116 represents one of a plurality of similar communication modules that are connected to ToR switch 114, and server rack 110 is pre-assembled with the communication modules attached at pre-determined mounting holes 113 along the back side of mounting flange 112. Here, after server chassis 120 is secured to server rack 110, communication module 126 can be collocated with the pre-placed communication module 116. In another embodiment, server chassis 120 is pre-assembled such that communication module 126 is attached to mounting ear 122. Here, when server chassis 120 is secured to server rack 110, communication module 126 is located so as to be collocated with communication module 116, without further installation required.

Figure 3:
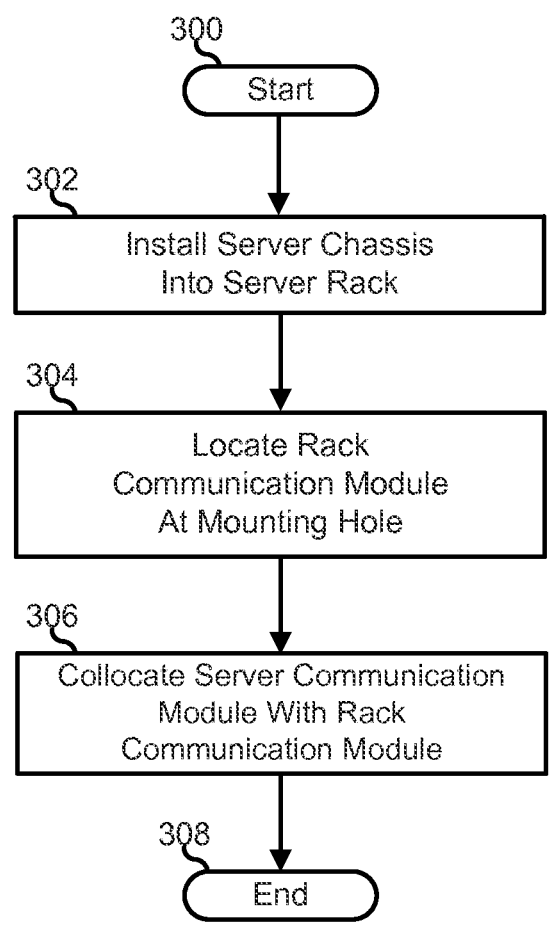
FIG. 3 is a flowchart illustrating a method for providing wireless rack management controller communication in a server rack.

FIG. 3 illustrates a method for providing wireless rack management controller communication in a server rack, starting at block 300. A server chassis is installed into a server rack in block 302. A communication module for the server rack is installed on a mounting flange of a server rack, and located at a particular mounting hole in block 304. A communication module for the server chassis is collocated with the server rack communication module in block 306 and the method ends in block 308.

Figure 4:
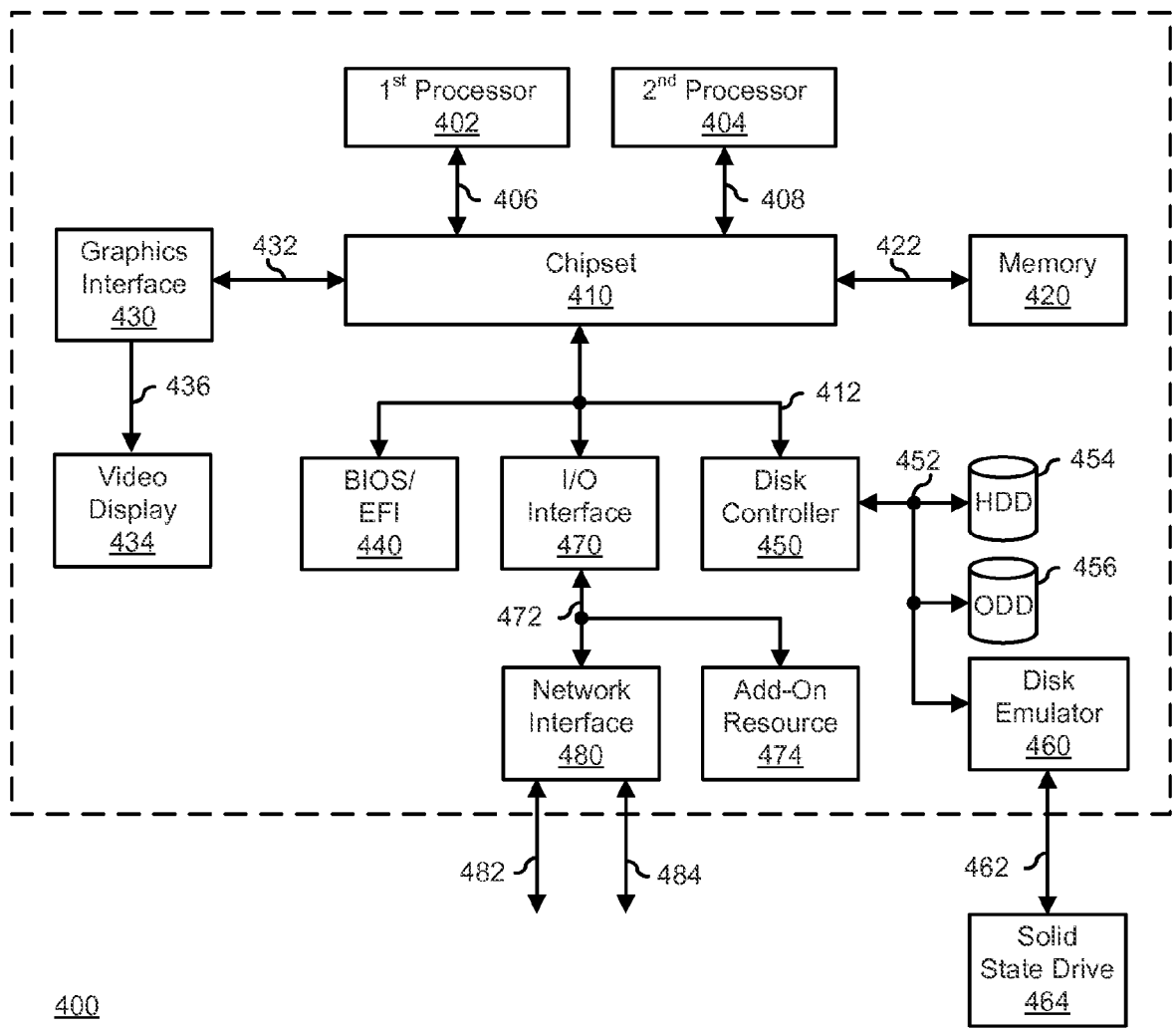
FIG. 4 is a block diagram illustrating a generalized information handling system according to an embodiment of the present disclosure.

FIG. 4 illustrates a generalized embodiment of information handling system 400. For purpose of this disclosure information handling system 400 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described above, and operates to perform one or more of the methods described above. Information handling system 400 includes a processors 402 and 404, a chipset 410, a memory 420, a graphics interface 430, include a basic input and output system/extensible firmware interface (BIOS/EFI) module 440, a disk controller 450, a disk emulator 460, an input/output (I/O) interface 470, and a network interface 480. Processor 402 is connected to chipset 410 via processor interface 406, and processor 404 is connected to the chipset via processor interface 408. Memory 420 is connected to chipset 410 via a memory bus 422. Graphics interface 430 is connected to chipset 410 via a graphics interface 432, and provides a video display output 436 to a video display 434. In a particular embodiment, information handling system 400 includes separate memories that are dedicated to each of processors 402 and 404 via separate memory interfaces. An example of memory 420 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 440, disk controller 450, and I/O interface 470 are connected to chipset 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 410 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 440 includes BIOS/EFI code operable to detect resources within information handling system 400, to provide drivers for the resources, initialize the resources, and access the resources. BIOS/EFI module 440 includes code that operates to detect resources within information handling system 400, to provide drivers for the resources, to initialize the resources, and to access the resources.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O interface 470 includes a peripheral interface 472 that connects the I/O interface to an add-on resource 474 and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as chipset 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

The skilled artisan will recognize that, where a particular device type, standard, or operation is specified, that suitable alternatives as needed or desired can be incorporated along with the teachings herein. For example, where the present disclosure describes network communications such as Ethernet communications, other communication standards, hardware, or software can be utilized to provide communications of sufficient bandwidth to perform the operations, teachings, and methods as disclosed herein.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. An information handling system, comprising:
a server rack including:
a mounting flange having a plurality of first mounting holes, the mounting flange and the first mounting holes being in conformance with an Electronics Industries Alliance (EIA) Standard EIA-310; and a first communication device affixed to a back side of the mounting flange and collocated with a first one of the first mounting holes; and a server chassis including:

a mounting ear having a plurality of second mounting holes, the mounting ear and the second mounting holes being in conformance with the EIA Standard EIA-310; and a second communication device affixed to a front side of the mounting ear and collocated with a first one of the second mounting holes;

wherein:

the server chassis is installed in the server rack such that a back side of the mounting ear is in contact with a front side of the mounting flange and is secured to the server rack via a fastener through a second one of the first mounting holes and a second one of the second mounting holes; and the second communication device is coupled to the first communication device through the first one of the first mounting holes and the first one of the second mounting holes.

2. The information handling system of claim 1, wherein the first communication device is coupled to the second communication device via a wireless communication interface that is transmitted through the first one of the first mounting holes and the first one of the second mounting holes.

3. The information handling system of claim 2, wherein the wireless communication interface comprises a radio-based communication interface.

4. The information handling system of claim 3, wherein the wireless communication interface comprises an optical-based communication interface.

5. A method, comprising:

providing, on a server rack, a mounting flange having a plurality of first mounting holes, the mounting flange and the first mounting holes being in conformance with an Electronics Industries Alliance (EIA) Standard EIA-310;

providing, on the server rack, a first communication device affixed to a back side of the mounting flange and collocated with a first one of the first mounting holes;

providing, on a server chassis, a mounting ear having a plurality of second mounting holes, the mounting ear and the second mounting holes being in conformance with the EIA Standard EIA-310;

providing, on the server chassis, a second communication device affixed to a front side of the mounting ear and collocated with a first one of the second mounting holes;

securing the server chassis to the server rack such that a back side of the mounting ear is in contact with a front side of the mounting flange, wherein the server chassis is secured to the server rack via a fastener through a second one of the first mounting holes and a second one of the second mounting holes; and coupling the first communication device to the second communication device through the first one of the first mounting holes and the first one of the second mounting holes.

6. The method of claim 5, wherein the first communication device is coupled to the second communication device via a wireless communication interface that is transmitted through the second mounting hole.

7. The method of claim 6, wherein the wireless communication interface comprises a radio-based communication interface.

8. The method of claim 6, wherein the wireless communication interface comprises an optical-based communication interface.

9. The information handling system of claim 1, wherein the first communication device is coupled to the second communication device to provide a network fabric connection to the server chassis.

10. The information handling system of claim 9, wherein the network fabric comprises one of an Ethernet fabric and a FiberChannel fabric.

11. The information handling system of claim 1, wherein the server rack further includes a top-of-rack switch coupled to the first communication device, wherein a cable between the top-of-rack switch and the first communication device is route in a side of the server rack on the back side of the server rack.

12. The method of claim 5, wherein the first communication device is coupled to the second communication device to provide a network fabric connection to the server chassis.

13. The method of claim 12, wherein the network fabric comprises one of an Ethernet fabric and a FiberChannel fabric.

14. The method of claim 5, further comprising:

coupling the first communication device to a top-of-rack switch of the server rack; and routing a cable between the top-of-rack switch and the first communication device in a side of the server rack on the back side of the server rack.

* * * * *